United States Patent
Zhang et al.

(10) Patent No.: US 10,573,670 B2
(45) Date of Patent: Feb. 25, 2020

(54) ARRAY SUBSTRATE, METHOD FOR FABRICATING THE SAME, DISPLAY DEVICE AND METHOD FOR DRIVING DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Zihe Zhang, Beijing (CN); Bin Ji, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 62 days.

(21) Appl. No.: 15/132,566

(22) Filed: Apr. 19, 2016

(65) Prior Publication Data
US 2017/0039982 A1    Feb. 9, 2017

(30) Foreign Application Priority Data

Aug. 7, 2015   (CN) .......................... 2015 1 0484924

(51) Int. Cl.
*H01L 27/12*    (2006.01)
(52) U.S. Cl.
CPC .......... *H01L 27/127* (2013.01); *H01L 27/124* (2013.01); *H01L 27/1255* (2013.01); *G09G 2310/0286* (2013.01)

(58) Field of Classification Search
CPC .. G09G 3/3696; G09G 3/3677; G09G 3/6888; G09G 3/3291; G09G 3/3266;
(Continued)

(56) References Cited

U.S. PATENT DOCUMENTS

2002/0089496 A1*  7/2002  Numao ............... G09G 3/3258
                                                          345/204
2003/0011314 A1*  1/2003  Numao ............... G09G 3/3233
                                                          315/169.3
(Continued)

FOREIGN PATENT DOCUMENTS

CN          1402067 A          3/2000
CN          1365093 A          8/2002
(Continued)

OTHER PUBLICATIONS

First Chinese Office Action dated Jan. 11, 2017; Appln. No. 201510484924.8.

*Primary Examiner* — Nitin Patel
*Assistant Examiner* — Amen Woldesenbet Bogale
(74) *Attorney, Agent, or Firm* — Ladas & Parry LLP; Hermine Valizadeh

(57) ABSTRACT

An array substrate, a method for fabricating the same, a display device and a drive method thereof are disclosed. In the array substrate, a pixel data storage circuit and a R/W control circuits for controlling the pixel data storage circuits are formed within a display region of the array substrate and read/write is realized by a R/W data line and a R/W control line extending into a non-display region of the array substrate. It can thereby avoid arranging GRAM in the data drive circuit, so as to reduce the size of the data drive circuit, which is beneficial to the light-weighting and thinning of the display device.

17 Claims, 2 Drawing Sheets

(58) Field of Classification Search
CPC .. G09G 3/3258; G09G 3/3648; G09G 3/3233; G09G 3/2081; G09G 3/2085; G09G 3/3659; G09G 3/2022; G09G 3/2011; G09G 3/3275; G09G 3/2018; G09G 3/3208; G09G 3/3225; G09G 3/367–3696; G09G 3/36; G09G 3/32; G09G 3/00; G09G 2300/0842; G09G 2300/0828; G09G 2300/0857; G09G 2300/0809; G09G 2300/0852; G09G 2300/0861; G09G 2300/0426; G09G 2300/08; G09G 2300/0876; G09G 2300/088; G09G 2300/0804; G09G 2310/0297; G09G 2310/027; G09G 2310/0218; G09G 2310/0286; G09G 2310/021; G09G 2310/0278; G09G 2310/0294; G09G 2310/0267; G09G 2310/0251; G09G 2310/0262; G09G 2310/061; G09G 2310/0289; G09G 2310/0291; G09G 2330/023; G09G 2330/021; G09G 2360/12; G09G 2360/18; G09G 2360/121; G09G 2360/123; G09G 2360/125; G09G 2360/126; G09G 2360/127; G09G 2360/128; G09G 5/393; G09G 5/395; G09G 5/397; G09G 5/399; G09G 5/36; G09G 5/363; G09G 5/366; G09G 5/39; G09G 2360/122; G02F 1/136213; G02F 1/1368; G02F 1/13624; G02F 1/13306; G02F 1/15; G02F 1/133; G11C 11/405; G11C 11/403; G11C 11/401; H01L 27/124; H01L 27/3244

See application file for complete search history.

(56) References Cited

U.S. PATENT DOCUMENTS

| | | | | |
|---|---|---|---|---|
| 2005/0274949 | A1* | 12/2005 | Yamazaki | H01L 51/5206 257/59 |
| 2008/0218389 | A1* | 9/2008 | Yamagata | G09G 3/2096 341/100 |
| 2011/0215331 | A1* | 9/2011 | Yamazaki | H01L 21/02554 257/60 |

FOREIGN PATENT DOCUMENTS

| | | |
|---|---|---|
| CN | 202886781 U | 4/2013 |
| JP | 2007-286237 A | 11/2007 |

\* cited by examiner

US 10,573,670 B2

ARRAY SUBSTRATE, METHOD FOR FABRICATING THE SAME, DISPLAY DEVICE AND METHOD FOR DRIVING DISPLAY DEVICE

FIELD OF THE ART

Embodiments of the invention relate to the field of display technologies, especially to an array substrate, a display device, a method for fabricating the same and a method for driving a display device.

BACKGROUND

For the purpose of reducing power consumption of display devices, the conventional technologies provide Liquid Crystal Displays (LCDs) with a Graphic Random Access Memory (GRAM) architecture, which is arranged on a data drive circuit. As the GRAM in the conventional technologies is generally formed on the data drive circuit in the form of a printed circuit, the area of the data drive circuit will therefore be increased, which is adversary to the light-weighting and thinning of the display devices.

SUMMARY

A first aspect of the invention provides an array substrate, comprising a base substrate as well as a pattern of gate lines and a pattern of drive data lines formed on the base substrate; gate lines of the pattern of the gate line and drive data lines of the pattern of the drive data line divide the array substrate into a plurality of pixels. The array substrate further comprises a pixel data storage circuit, a read/write data line, a read/write control circuit and a read/write control line formed on the base substrate; the read/write control circuit is connected to the pixel data storage circuit, the read/write data line and the read/write control line respectively, and is configured to control read and write of the data to the pixel data storage circuit from the read/write data line through the read/write control line. The pixel data storage circuit and the read/write control circuit are formed within a display region of the array substrate and the read/write data line and the read/write control line extend into a non-display region of the array substrate.

A second aspect of the invention provides a method for fabricating the above array substrate. The method comprises a step of forming a pattern of gate lines and a pattern of drive data lines on the base substrate; gate lines of the pattern of gate line and drive data lines of the pattern of drive data line divide the array substrate into a plurality of pixels. The method further comprises: forming a pixel data storage circuit, a read/write data line, a read/write control circuit and a read/write control line on the base substrate; the read/write control circuit is connected to the pixel data storage circuit, the read/write data line and the read/write control line respectively, and is configured to control read and write of data to the pixel data storage circuit from the read/write data line through the read/write control line; the pixel data storage circuit and the read/write control circuit are formed within a display region of the array substrate, and each of the read/write data line and the read/write control line extends into a non-display region of the array substrate.

A third aspect of the invention provides a display device comprising the above array substrate.

A fourth aspect of the invention provides a method for driving the above display device, wherein the display device comprises the above array substrate, and the method comprises:

applying a control signal to a read/write control line when a pixel data is received from a host computer and writing a received pixel data to a pixel data storage circuit through a read/write data line; and applying a control signal to the read/write control line, reading the pixel data from the pixel data storage circuit, transforming the pixel data to a data voltage and input the data voltage to a corresponding data line of the pattern of drive data lines during scan driving.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
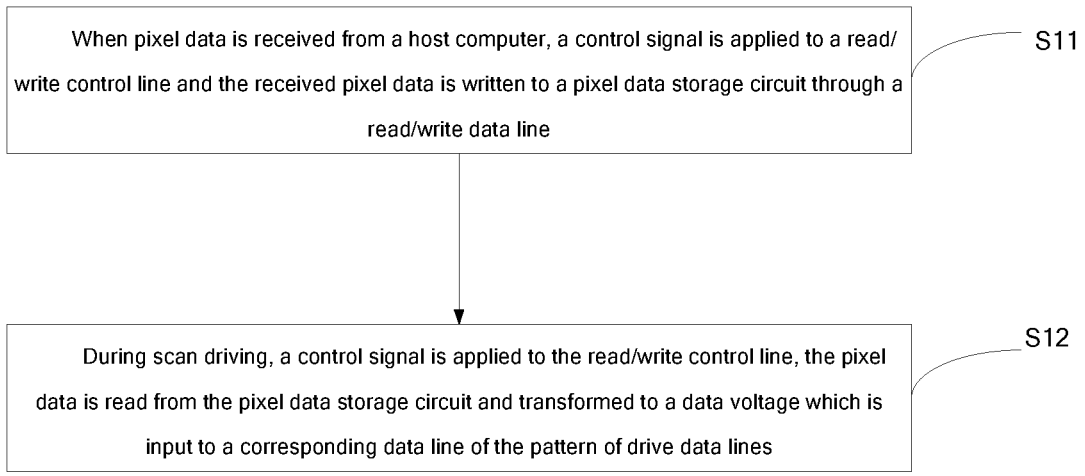
FIG. 1 schematically illustrates a flow chart of a drive method for a display device in accordance with an embodiment of the invention.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

An embodiment of the invention provides an array substrate, comprising a base substrate as well as a pattern of gate lines and a pattern of drive data lines formed on the base substrate; gate lines of the pattern of the gate lines and drive data lines of the pattern of the drive data lines divide the array substrate into a plurality of pixels. The array substrate further comprises a pixel data storage circuit, a read/write data line, a read/write control circuit and a read/write control line, all of which are formed on the base substrate; the read/write control circuit is connected to the pixel data storage circuit, the read/write data line and the read/write control line respectively, and is configured to control read and write of the data to the pixel data storage circuit from the read/write data line through the read/write control line. The pixel data storage circuit and the read/write control circuit are formed within a display region of the array substrate, and the read/write data line and the read/write control line extend into a non-display region of the array substrate.

In the array substrate provided by the embodiment, the pixel data storage circuit and the read/write control line for controlling the pixel data storage circuit are formed within the display region of the array substrate, and the read and write are realized by the read/write data line and the read/write control line extending to the non-display region of the array substrate. Therefore, the need of arranging a GRAM in the data drive circuit can be eliminated, which reduces the size of the data drive circuit and is beneficial to the light-weighting and thinning of the display device.

Another embodiment of the invention provides a method for fabricating an array substrate, which is used to fabricate the array substrate of the above embodiment. The method comprises:

a step of forming a pattern of gate lines and a pattern of drive data lines on the base substrate, the gate lines of the pattern of the gate lines and the drive data lines of the pattern of the drive data lines divide the array substrate into a plurality of pixels.

The method further comprises: forming a pixel data storage circuit, a read/write data line, a read/write control circuit and a read/write control line on the base substrate; the read/write control circuit is connected to the pixel data storage circuit, the read/write data line and the read/write control line respectively, and is configured to control read and write of data to the pixel data storage circuit from the read/write data line through the read/write control line; the pixel data storage circuit and the read/write control circuit are formed within a display region of the array substrate, and each of the read/write data line and the read/write control line extends into a non-display region of the array substrate.

Still another embodiment of the invention provides a display device which comprises the array substrate of the above embodiment. The display device may be an e-paper, a mobile phone, a tablet PC, a television, a display device, notebook PC, a digital photoframe, a navigator and any product or component having a display function.

Yet another embodiment of the invention provides a method for driving a display device, which is used to drive the display device of the above embodiment. With reference to FIG. 1, the method may be performed by a data drive circuit and comprises:

Step S11: When pixel data is received from a host computer, a control signal is applied to a read/write control line and the received pixel data is written to a pixel data storage circuit through a read/write data line.

Step S12: During scan driving, a control signal is applied to the read/write control line, the pixel data is read from the pixel data storage circuit and transformed to a data voltage which is input to a corresponding data line of the pattern of drive data lines.

Figure 2:
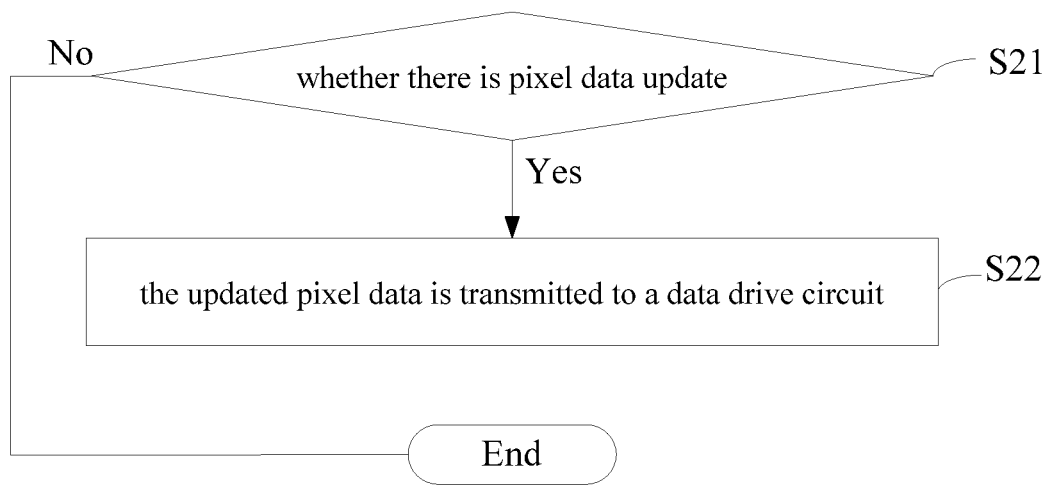
FIG. 2 schematically illustrates a flow chart of a pixel data transmission method in accordance with an embodiment of the invention.

Another embodiment of the invention provides a method for transmitting pixel data and executable by a host computer of a display device. With reference to FIG. 2, the method comprises:

Step S21: it is determined whether there is pixel data update. If yes, it proceeds to step S22; otherwise, the flow ends.

Step S22: the updated pixel data is transmitted to a data drive circuit.

By this means, when a picture to be displayed in a current frame is the same as that of the previous frame, the host computer of the display device no longer sends pixel data to the data drive circuit; instead, the data drive circuit charges and discharges each pixel according to the pixel data of the previous frame stored in the pixel data storage circuit, thereby realizing the relevant picture display. When the picture to be display in the current frame is different frame the previous frame, the host computer sends pixel data corresponding to the current frame to the data drive circuit. The data drive circuit stores the received pixel data in the pixel data storage circuit and charges and discharges each pixel according to the stored pixel data, thereby realizing the relevant picture display. Therefore, when the picture to be displayed in the current frame is the same as that of the previous frame, the procedure of sending the pixel data to the data drive circuit by the host computer is omitted. For some application scenarios such as when stationary pictures are displayed, it can significantly reduce the power consumption of the display device.

In detailed implementations, specific structures of the above array substrate may be in different forms, which will have different fabrication methods and drive methods. In the following, a configuration, fabrication method and drive method of one of the array substrate will be described in connection with the drawings. In the array substrate provided by the embodiment of the invention, the pattern of gate lines and the pattern of data lines may be the same as that of the conventional arts, which will not be elaborated in the following.

Figure 3:
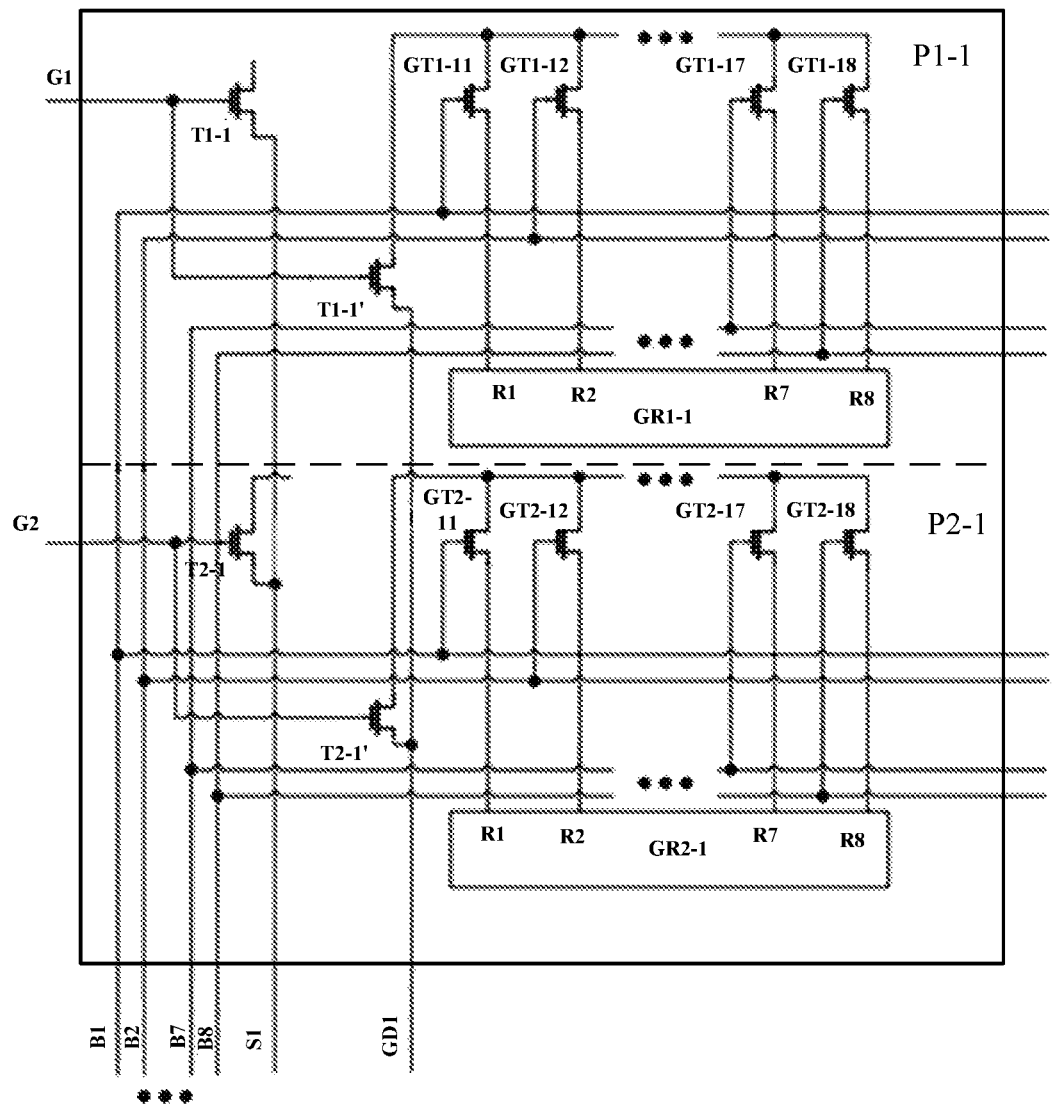
FIG. 3 schematically illustrates two pixels in the same column on an array substrate provided by an embodiment of the invention.

With reference to FIG. 3, it schematically illustrates two pixels P1-1 and P2-1 in the same column on an array substrate provided by an embodiment of the invention. The array substrate comprises a base substrate (not shown), gate lines G1 and G2 formed on the base substrate, a drive data line S1, eight read/write (R/W) control lines B1, B2, . . . B8, a R/W data line GD1. Within each pixel Px-1 (herein and thereafter, x is 1 or 2), there are a pixel switch Tx-1, a R/W control circuit, and a pixel data storage circuit GRx-1, wherein the R/W control circuit comprises a bus R/W switch Tx-1' and eight bit data R/W switches GTx-11, GTx-12, . . . , GTx-17, GTx-18, and the pixel data storage circuit Grx-1 has 8-bit data R/W terminals R1, R2, . . . , R8, enabling storage of 8-bit pixel data. All the switches are N-type transistors, with turn-ON level being a high level. The gate electrode of the pixel switch Tx-1 and the gate electrode of the bus R/W switch Tx-1' are both connected to the gate line Gx. The source electrode of the pixel switch Tx-1 is connected to the data line S1. The source electrode of the bus R/W switch Tx-1' is connected to the R/W data line GD1, and the drain electrode thereof is connected to the source electrodes of the eight bit data R/W switches GTx-11, GTx-12, . . . , GTx-17, GTx-18. For any bit data R/W switch GTx-1n (n is an integer from 1 to 8) of the eight bit data R/W switches GTx-11, GTx-12, GTx-17, GTx-18, the gate electrode is connected to the R/W control line Bn, the source electrode is connected to the drain electrode of the bus R/W switch Tx-1', and the drain electrode is connected to a corresponding bit data R/W terminal Rn. Herein, all of the gate lines G1 and G2, the drive data line S1, the eight R/W control lines B1, B2, . . . , B8 and the R/W data line GD1 extend into the non-display region of the array substrate. Specifically, the non-display region may be a peripheral region of the base substrate, that is, the region outside the square marked by solid lines in FIG. 3. In this non-display region, the R/W data line and the R/W control line, the data line may be connected to corresponding signal interfaces.

As an example, a method for driving a display comprising an array substrate as illustrated in FIG. 3 comprises:

If a current frame receives pixel data sent by the host computer and the pixel data includes pixel data corresponding to the pixel P1-1, a high level gate scan pulse is applied to the gate line G1, the bus R/W switch T1-1' is turned on. At this time, high level pulses are applied sequentially to respective bit R/W control lines B1-B8 to turn on respective bit data R/W switches GT1-11, GT1-12, . . . , GT1-17, GT1-18. At the same time, when any of the bit data R/W switch GT1-1n is turned on, a voltage corresponding to the nth bit of the 8-bit pixel data is applied to the drive data line S1, such that pixel data corresponding to each pixel P1-1 is written to the pixel data storage circuit GR1-1. Similarly, during the process when the bus R/W switch T1-1' is turned on, after the pixel data is written to the pixel data storage circuit GR1-1, the respective bit data R/W switches GT1-11, GT1-12, . . . , GT1-17, GT1-18 are sequentially turned on, and the pixel data written to the pixel data storage circuit GR1-1 is read out from the pixel data storage circuit GR1-1 by the R/W data line GD1. After that, the data voltage corresponding to the read pixel data is obtained and then written to the corresponding storage capacitor through the drive data line S1 and the pixel switch T1-1, thereby realizing display.

If the current frame does not receive pixel data corresponding to the pixel P1-1, then the pixel data previously written to the pixel data storage circuit GR1-1 may be read from the pixel data storage circuit GR1-1 directly by the R/W data line GD1.

For the procedure of driving the pixel P2-1 during display, please refer to that for the pixel P1-1, which will not be elaborated here.

In the embodiment of the invention, a pixel data storage circuit is fabricated in each pixel (referring to a rectangular region defined by two neighboring gate lines and two neighboring data liens), such that the area of each pixel data storage circuit is relatively small, which can facilitate the arrangement of the pixel data storage circuit. It can easily be understood that though the above embodiment is described with reference to an example where one pixel data storage circuit and one R/W control circuit are formed in each pixel, one relatively large pixel data storage circuit may be formed in some of a plurality of pixels in real application. Such a technical solution can still solve the technical problem to be solved by the invention and is within the scope of protection of the invention. Moreover, even if only one pixel data storage circuit is fabricated or even if the pixel data storage circuits are arranged in a same region of the display region instead of being distributed discretely in the display region, such a technical solution can still solve the technical problem to be solved by the invention and is within the scope of protection of the invention.

It can easily be understood that though the above embodiment is described with reference to an example where the pixel data stored by the pixel data storage circuit is of 8 bits, the above pixel data storage circuit may also be designed as storing pixel data of 4 bits or other number of bits in real applications, with the number of the corresponding bit data R/W switches and the number of control lines being the same as that of the bits of the pixel data.

In the embodiment of the invention, each of the two R/W control circuits comprises a bus R/W switch and a bit data R/W switch which are all connected to the same R/W control line, thereby reducing the number of R/W control lines and making the layout of traces on the array substrate easier. However, in real applications, the above R/W control circuits may adopt a different configuration.

The above embodiment of the invention is described with reference to an example where eight R/W control lines are configured for each pixel data R/W circuit. However, in real applications, one R/W control line may be used for each pixel data R/W circuit, in this case, the above R/W control circuit further comprises a shift register formed by cascading eight shift register units. Moreover, gate electrodes of the respective bit data R/W switches may be connected to shift signal output terminals of the eight shift register units in a one-to-one correspondence and the shift signal input terminal of the first stage of shift register unit is connected to the R/W control line. By this means, the eight data R/W switches are sequentially conducted by applying one start-up signal to the R/W control line. In this case, in the case that the control terminals of the respective bus R/W switches are connected to the gate line, the shift registers of the pixel data storage circuits corresponding to the respective pixels in the same column may be connected to the same R/W control line, which is the control line connected to the respective shift registers.

In the embodiment of the invention, gate electrodes of the bus R/W switches T1-1' and T2-1" of two pixels P1-1 and P1-2 in the same column are connected to gate lines G1 and G2 of the corresponding rows, and source electrodes thereof are connected to the same R/W data line GD1. By this means, it not only get rid of the two R/W control lines respectively used to control the two bus R/W switches T1-1' and T2-1' but also reduce the number of R/W data lines used. It can easily be understood that in real applications two separate R/W control lines may be configured for the above bus R/W switches T1-1' and T2-1' respectively, or the source electrodes of the bus R/W switches T1-1' and T2-1' may be connected to different R/W data lines, such that the objectives of the invention may also be achieved. Such technical solutions are also within the scope of the invention.

The array substrate provided by the embodiments of the invention may be a Liquid Crystal Display array substrate or an Organic Light-Emitting Diode array substrate.

As an example, a method for fabricating the above array substrate comprises:

In the same process, a same patterning process is used to form pixel data storage circuits GR1-1 and GR2-1, bus R/W switches T1-1' and T2-1', the individual bit data R/W switches GT1-11, GT1-12, . . . , GT1-18 and GT2-11, GT2-12, . . . , GT2-18, both the pixel switches T1-1 and T2-1, as well as the drive data line S1, R/W data line GD1 and the individual R/W control lines B1-B8. For example, exposing and developing may be used to first form gate electrodes of the respective switches and the data line and control line connected to the respective gate electrodes. After that, a gate insulation layer material is deposited on the gate electrode and then patterned to get the gate insulation layer. Then a patterning process is used to form source/drain electrodes of the respective switches and to form data lines connected to the source/drain electrodes. It can thereby reduce the fabrication difficulty. Other fabrication processes may also be used to form the above structure and meet the general objectives of the invention, which is also within the scope of the invention.

The present application claims priority from Chinese Application No. 201510484924.8, filed on Aug. 7, 2015, the disclosure of which is incorporated herein by reference in its entirety.

What is described above is related to the illustrative embodiments of the disclosure only and not limitative to the scope of the disclosure; the scopes of the disclosure are defined by the accompanying claims.

What is claimed is:

1. An array substrate, comprising a base substrate;
a pattern of gate lines and a pattern of drive data lines formed on the base substrate, gate lines of the pattern of gate lines and drive data lines of the pattern of drive data lines being configured to divide the array substrate into a plurality of pixels, the drive data lines being configured to transmit a data voltage of the pixel data of a pixel;
wherein each of pixels comprises:
only one pixel switch, comprising a gate electrode connected to one of the gate lines;
a pixel data storage circuit, configured to store the pixel data of the pixel;

a read/write data line, located in a display region of the array substrate and extending into a non-display region of the array substrate, the read/write data line being insulated and spatially apart from the drive data lines and configured to read and write the pixel data of the pixel to the pixel data storage circuit;

a read/write control circuit, comprising:
   a bus read/write switch, spatially apart from the pixel switch and comprises a first terminal, a second terminal, and a control terminal, the second terminal of the bus read/write switch being connected to the read/write data line, and the control terminal being connected to the one of the gate lines connected to the gate electrode of the pixel switch; and
   a plurality of data read/write switches, all the data read/write switches being connected to the first terminal of the bus read/write switch; and
a plurality of read/write control line, connected to the plurality of data read/write switches with a one-to-one correspondence,
wherein the read/write data line is configured to write N bit pixel data of the pixel into the pixel data storage circuit and read the N bit pixel data of the pixel from the pixel date storage circuit,
wherein the drive data lines is configured to transmit a data voltage corresponding to any bit of the N bit pixel data to the pixel data storage circuit, and transmit the data voltage corresponding to any bit of the N bit pixel data read from the pixel data storage circuit to a storage capacitor, and
wherein a source electrode of the pixel switch is connected to one of the drive data line.

2. The array substrate of claim 1, wherein the pixel data storage circuit and the read/write control circuit are both of plurality and distributed discretely in the display region.

3. The array substrate of claim 2, wherein one pixel data storage circuit and one read/write control circuit are formed in each pixel and the read/write control circuit of the pixel is configured to store the pixel data of the pixel.

4. The array substrate of claim 3, wherein the plurality of data read/write switches comprises N bit data read/write switches, the plurality of read/write control line comprises N read/write control lines, the pixel data storage circuit comprises N bit data read/write terminals, and each of the N bit data read/write terminals is configured to read and write one bit data of the pixel data;
   first terminals of the N bit data read/write switches are connected to read terminals of the pixel data storage circuit with a one-to-one correspondence, second terminals of the N bit data read/write switches are all connected to the first terminal of the bus read/write switch, and control terminals of the N bit data read/write switches are connected to the N read/write control lines with a one-to-one correspondence.

5. The array substrate of claim 3, wherein the plurality of data read/write switches comprises N bit data read/write switches and one shift register formed by cascade of N shift register units, the pixel data storage circuit comprises N bit data read/write terminals, and each of the N bit data read/write terminals is configured to read and write one bit data of the pixel data;
   first terminals of the N bit data read/write switches are connected to the N bit data read terminals of the pixel data storage circuit with a one-to-one correspondence, second terminals of the N bit data read/write switches are all connected to the first terminal of the bus read/write switch, and control terminals of the N bit data read/write switches are connected to shift signal output terminals of the N shift register units with a one-to-one correspondence; an input terminal of a first stage of shift register units in the shift register is connected to one of the plurality of read/write control lines.

6. The array substrate of claim 4, wherein a read/write control line connected to a read/write control circuit in one pixel of a column of pixels is the same with that connected to other read/write control circuits in other pixels in the same column;
   the control terminal of the bus read/write switch of the read/write control circuit in any pixel of a row of pixels is connected to the gate line connected to the row of pixels, and is switched ON by applying a gate scan pulse to the gate line.

7. The array substrate of claim 1, wherein both the pixel data storage circuit and the read/write control circuit are formed on the base substrate by way of a patterning process.

8. The array substrate of claim 1, wherein the array substrate is a liquid crystal display array substrate or an organic light emitting diode array substrate.

9. A method for fabricating the array substrate of claim 1, comprising:
   forming a pattern of gate lines and a pattern of drive data lines on the base substrate, gate lines of the pattern of gate lines and drive data lines of the pattern of drive data line being configured to divide the array substrate into a plurality of pixels, the drive data lines being configured to transmit a data voltage of the pixel data of a pixel;
   wherein each of pixels comprises:
      only one pixel switch, comprising a gate electrode connected to one of the gate lines;
      a pixel data storage circuit, configured to store the pixel data of the pixel;
      a read/write data line, located in a display region of the array substrate and extending into a non-display region of the array substrate, the read/write data line being insulated and spatially apart from the drive data lines and configured to read and write the pixel data of the pixel to the pixel data storage circuit;
      a read/write control circuit, comprising:
         a bus read/write switch, spatially apart from the pixel switch and comprises a first terminal, a second terminal, and a control terminal, the second terminal of the bus read/write switch being connected to the read/write data line, and the control terminal being connected to the one of the gate lines connected to the gate electrode of the pixel switch; and
         a plurality of data read/write switches, all the data read/write switches being connected to the first terminal of the bus read/write switch; and
      a plurality of read/write control line, connected to the plurality of data read/write switches with a one-to-one correspondence,
      wherein the read/write data line is configured to write N bit pixel data of the pixel into the pixel data storage circuit and read the N bit pixel data of the pixel from the pixel data storage circuit,
      wherein the drive data lines is configured to transmit a data voltage corresponding to any bit of the N bit pixel data to the pixel data storage circuit, and transmit the data voltage corresponding to any bit of the N bit pixel data read from the pixel data storage circuit to a storage capacitor, and wherein a source electrode of the pixel switch is connected to one of the drive data line.

10. The method of claim 9, wherein the pixel data storage circuit and the read/write control circuit are formed during the step of forming the pattern of gate lines and the pattern of drive data lines.

11. A display device, comprising the array substrate of claim 1.

12. A method for driving the display device of claim 11, and the method comprising:
applying a control signal to the plurality of read/write control line when the pixel data is received from a host computer and writing a received pixel data to the plurality of pixel data storage circuit through the read/write data line;
applying a control signal to the plurality of read/write control line, reading the pixel data from the pixel data storage circuit, transforming the pixel data to a data voltage and input the data voltage to a corresponding drive data line of the pattern of drive data lines during scan driving.

13. The method of claim 12, and the step of applying the control signal to the plurality of read/write control line and writing the received pixel data to the pixel data storage circuit through the plurality of read/write data line comprises:
for each of the pixel data storage circuit, applying a control signal to conduct the bus read/write switch and conduct the N bit data read/write switches of each read/write control circuit sequentially, and writing N bit data of one pixel data to the pixel data storage circuit sequentially;
the step of applying a control signal to the plurality of read/write control line, reading the pixel data from the pixel data storage circuit, transforming the pixel data to a data voltage and input the data voltage to a corresponding data line of the pattern of drive data lines during scan driving comprises:
for each of the pixel data storage circuit, applying a control signal to conduct the bus read/write switch and conduct the N bit data read/write switches of each read/write control circuit sequentially, and reading N bit data of one pixel data from the pixel data storage circuit sequentially.

14. The array substrate of claim 5, wherein a read/write control line connected to a read/write control circuit in one pixel of a column of pixels is the same with that connected to other read/write control circuits in other pixels in the same column;
the control terminal of the bus read/write switch of the read/write control circuit in any pixel of a row of pixels is connected to the gate line connected to the row of pixels, and is switched ON by applying a gate scan pulse to the gate line.

15. The array substrate of claim 1, wherein the second terminal of the bus read/write switch is a source electrode connected to the read/write data line.

16. An array substrate, comprising:
a base substrate; and
gate lines and drive data lines, formed on the base substrate and configured to divide the array substrate into a plurality of pixels, the drive data lines being configured to applying a data voltage of a pixel data,
wherein each of pixels comprises:
a pixel switch comprising a gate electrode connected to one of the gate lines,
a pixel data storage circuit, configured to store the pixel data;
a read/write data line, insulated from and spatially apart from the drive data lines and configured to read and write the pixel data to the pixel data storage circuit;
a bus read/write switch, spatially apart from the pixel switch and comprises a first terminal, a second terminal, and a control terminal, the second terminal of the bus read/write switch being connected to the read/write data line, and the control terminal being connected to the one of the gate lines connected to the gate electrode of the pixel switch;
a plurality of data read/write switches, all the data read/write switches being connected to the first terminal of the bus read/write switch; and
a plurality of read/write control line, connected to the plurality of data read/write switches with a one-to-one correspondence,
wherein the read/write data line is configured to write N bit pixel data of the pixel into the pixel data storage circuit and read the N bit pixel data of the pixel from the pixel data storage circuit,
wherein the drive data lines is, configured to transmit a data voltage corresponding to any bit of the N bit pixel data to the pixel data storage circuit, and transmit the data voltage corresponding to any bit of the N bit pixel data read from the pixel data storage circuit to a storage capacitor, and
wherein a source electrode of the pixel switch is connected to one of the drive data line.

17. The array substrate accordingly to claim 1, wherein the read/write data line is configured to read the pixel data from the pixel data storage circuit in such a manner that:
in condition that a picture to be display in a current frame is different from that of a previous frame, the pixel data corresponding to a pixel is written to the pixel data storage circuit and then read out from the pixel data storage circuit through the read/write control line;
in condition that the picture to be displayed in the current frame is same as that of a previous frame, the pixel data previously stored in the pixel data storage circuit is read out from the pixel data storage circuit through the read/write control line.

* * * * *